United States Patent
Ishimaru

(10) Patent No.: US 8,297,224 B2
(45) Date of Patent: Oct. 30, 2012

(54) SUBSTRATE PROCESSING APPARATUS

(75) Inventor: Nobuo Ishimaru, Takaoka (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 756 days.

(21) Appl. No.: 12/363,928

(22) Filed: Feb. 2, 2009

(65) Prior Publication Data

US 2009/0197425 A1    Aug. 6, 2009

(30) Foreign Application Priority Data

Feb. 4, 2008 (JP) ................................ 2008-023677
Dec. 17, 2008 (JP) ................................ 2008-320353

(51) Int. Cl.
*H01L 21/00* (2006.01)
*C23C 16/00* (2006.01)
*C23C 14/00* (2006.01)

(52) U.S. Cl. ............... 118/723 R; 118/725; 156/345.28; 156/345.43; 156/345.44; 156/345.48; 156/345.52

(58) Field of Classification Search .................. 118/715, 118/723 R
See application file for complete search history.

(56) References Cited

U.S. PATENT DOCUMENTS

| | | | |
|---|---|---|---|
| 6,719,876 B1 * | 4/2004 | Ueda et al. | 156/345.48 |
| 2004/0025786 A1 * | 2/2004 | Kontani et al. | 118/715 |
| 2005/0255255 A1 * | 11/2005 | Kawamura et al. | 427/569 |

* cited by examiner

*Primary Examiner* — Ram N. Kackar
(74) *Attorney, Agent, or Firm* — Brundidge & Stanger, P.C.

(57) ABSTRACT

An ALD apparatus includes: a process chamber that accommodates a boat charged with a plurality of wafers; gas supply systems that supplies process gases to the wafers; a pair of electrodes arranged in a stacked direction of the wafers; a high-frequency power source that supplies a high-frequency power to the pair of the electrodes; a variable impedance element connected to a front end opposite to the high-frequency power of the pair of the electrodes; and a control unit that changes an output frequency of the high-frequency power source. By moving the local minimum point of the voltage distribution through the change of the output frequency of the high-frequency power source during the plasma discharge, the plasma generation amount within a pair of discharge electrodes is uniformized. Thus, the processing non-uniformity between the wafers stacked in the boat is suppressed, and the processing is uniformized over the total boat length.

9 Claims, 9 Drawing Sheets

SUBSTRATE PROCESSING APPARATUS

CROSS-REFERENCE TO RELATED PATENT APPLICATION

This U.S. non-provisional patent application claims priority under 35 U.S.C. §119 of Japanese Patent Application Nos. 2008-023677, filed on Feb. 4, 2008, and 2008-320353, filed on Dec. 17, 2008, in the Japanese Patent Office, the entire contents of which are hereby incorporated by reference.

BACKGROUND OF THE INVENTION

1. Field of the Invention

The present invention relates to a substrate processing apparatus, and more particularly, to a batch type remote plasma processing apparatus.

For example, the present invention relates to a method for fabricating a semiconductor integrated circuit (hereinafter, referred to as an IC), which can be effectively used when depositing an insulation film or a metal film on a semiconductor wafer (hereinafter, referred to as a wafer) used to fabricate a semiconductor IC including a semiconductor device.

2. Description of the Prior Art

In IC fabrication methods, a batch type remote plasma processing apparatus has been proposed as a substrate processing apparatus for forming a film on a wafer at low temperature (for example, see Patent Document 1).

Such a batch type remote plasma processing apparatus always monitors temperature variation or pressure variation and gas flow rate variation in a process chamber in order to prevent undesired results such as an insufficient film thickness when a wafer is processed.

However, in the above-described batch type remote plasma processing apparatus, a voltage standing wave is generated because a pair of electrodes is opened at their front ends and is not matched with the impedance of an electrical wire. Therefore, the voltage amplitude is large at the front ends of the pair of the electrodes and is decreasing as closer to a high-frequency power source, and becomes a minimum value and then again increases.

Since the difference in the voltage amplitude according to locations of the pair of the electrodes causes the variation of plasma intensity according to locations, the batch type remote plasma processing apparatus has a problem that cannot process a plurality of stacked wafers uniformly.

SUMMARY OF THE INVENTION

Therefore, an object of the present invention is to provide a substrate processing apparatus which is capable of preventing non-uniform processing caused by non-uniformity of a voltage distribution.

According to an aspect of the present invention, there is provided a substrate processing apparatus, including: a process chamber configured to accommodate loaded substrates; a gas supply system configured to supply a process gas to the substrates; a pair of electrodes arranged in a stacked direction of the substrates; a high-frequency power source configured to supply a high-frequency power to the pair of the electrodes to generate plasma by exciting the process gas; a variable impedance element connected to a front end of the pair of the electrodes opposite to the high-frequency power source, the variable impedance element including a parallel resonance including a coil and a variable condenser arranged in parallel, both ends of the variable impedance element being connected to the pair of the electrodes in series; a control unit configured to change an output frequency of the high-frequency power source; a pair of protecting pipes having upper ends closed, and disposed to cover the pair of the electrodes; and a mounting pipe air-tightly sealed between the pair of the protecting pipes, wherein the variable impedance element is disposed inside the mounting pipe.

According to another aspect of the present invention, there is provided a substrate processing apparatus, including: a reaction tube configured to accommodate substrates and partitioned into a film forming space where desired films are formed on the substrates, and a plasma generation space where plasma is generated; a first gas supply system configured to supply a first process gas to the film forming space; a second gas supply system configured to supply a second process gas to the plasma generation space; a pair of electrodes disposed in the plasma generation space; a high-frequency power source configured to supply a high-frequency power to the pair of the electrodes to generate plasma by exciting the second process gas; a variable impedance element connected to a front end of the pair of the electrodes opposite to the high-frequency power source, the variable impedance element including a parallel resonance circuit including a coil and a variable condenser arranged in parallel, both ends of the variable impedance element being connected to the pair of the electrodes in series; a pair of protecting pipes having upper ends closed, and disposed to cover the pair of the electrodes; a mounting pipe air-tightly sealed between the pair of the protecting pipes, wherein the variable impedance element is disposed inside the mounting pipe; and a control unit configured to control at least the first gas supply system, the second gas supply system and the high-frequency power source, wherein the control unit controls the first gas supply system, the second gas supply system and the high-frequency power source in a manner that the first process gas and the second process gas excited by the plasma are alternately supplied to form a film on the surfaces of the substrates, and the control unit changes the output frequency of the high-frequency power source.

According to another aspect of the present invention, there is provided a method for manufacturing a semiconductor device, the method comprising: (a) loading a substrate into a process chamber; (b) exposing the substrate to a first process gas; (c) exhausting the first process gas; (d) exposing the substrate to a second process gas which is plasma-excited by applying a high-frequency power from a high-frequency power source to a pair of electrodes; (e) exhausting the second process gas; and (f) unloading the substrate from the process chamber, wherein a film is formed on the substrate by repeating the operations (b)~(e) alternately a plurality of times, and the output frequency of the high-frequency power source is changed in the operation (d).

According to another aspect of the present invention, there is provided a substrate processing apparatus, including: a reaction tube configured to accommodate a plurality of substrates in stacks and define a substrate processing space; a wall member including a plurality of holes installed in a substrate stacking direction and forming a buffer space of a process gas together with a part of a wall of the reaction tube; a gas supply unit communicating with an inside of the buffer space and supplying the process gas into the buffer space; a pair of electrodes disposed inside the buffer space to define an activation region of a reaction gas; a high-frequency power source supplying a high-frequency power to the pair of electrodes to generate plasma activating the process gas, wherein the gas supplied from the gas supply unit is activated inside the buffer space, and the plurality of substrates is processed by introducing activated gas into the substrate processing space through the plurality of holes; a variable impedance element connected to a front end the pair of the electrodes opposite to the high-frequency power source, the variable impedance element including a parallel resonance circuit including a coil and a variable condenser arranged in parallel, both ends of the variable impedance element being connected to the pair of the electrodes in series; a control unit configured to change an output frequency of the high-frequency power source; a pair of protecting pipes having upper ends closed, and disposed to cover the pair of the electrodes; and a mounting pipe air-tightly sealed between the pair of the protecting pipes, wherein the variable impedance element is disposed inside the mounting pipe.

DETAILED DESCRIPTION OF THE PREFERRED EMBODIMENTS

Hereinafter, an embodiment of the present invention will be described with reference the attached drawings.

A substrate processing apparatus relevant to the present invention is configured by an Atomic Layer Deposition (ALD) apparatus which performs an ALD method. The ALD method is one of plasma CVD methods for forming a film on a substrate such as a wafer by using plasma.

The ALD method is a method which forms a film by using a surface reaction. Specifically, the ALD method is a method which makes film forming gases adsorbed on the substrate with atomic unit by supplying two (or more) kinds of the film forming gases used for film formation sequentially and alternately under certain film forming conditions (temperature, time, and the like).

For example, when forming a silicon nitride (SiNx) layer, the ALD method can form a high-quality film at a low temperature of 300-600° C. by using dichlorosilane ($SiH_2Cl_2$: DCS) gas and ammonia ($NH_3$) gas.

A plurality of kinds of reactive gases are sequentially supplied one by one.

The control of film thickness may be performed by number of cycles of the reactive gas supply. For example, assuming that a film forming speed is 1 Å/cycle, a 20 Å film is formed by 20 cycles of supplying the plurality of kinds of gases.

Figure 1:
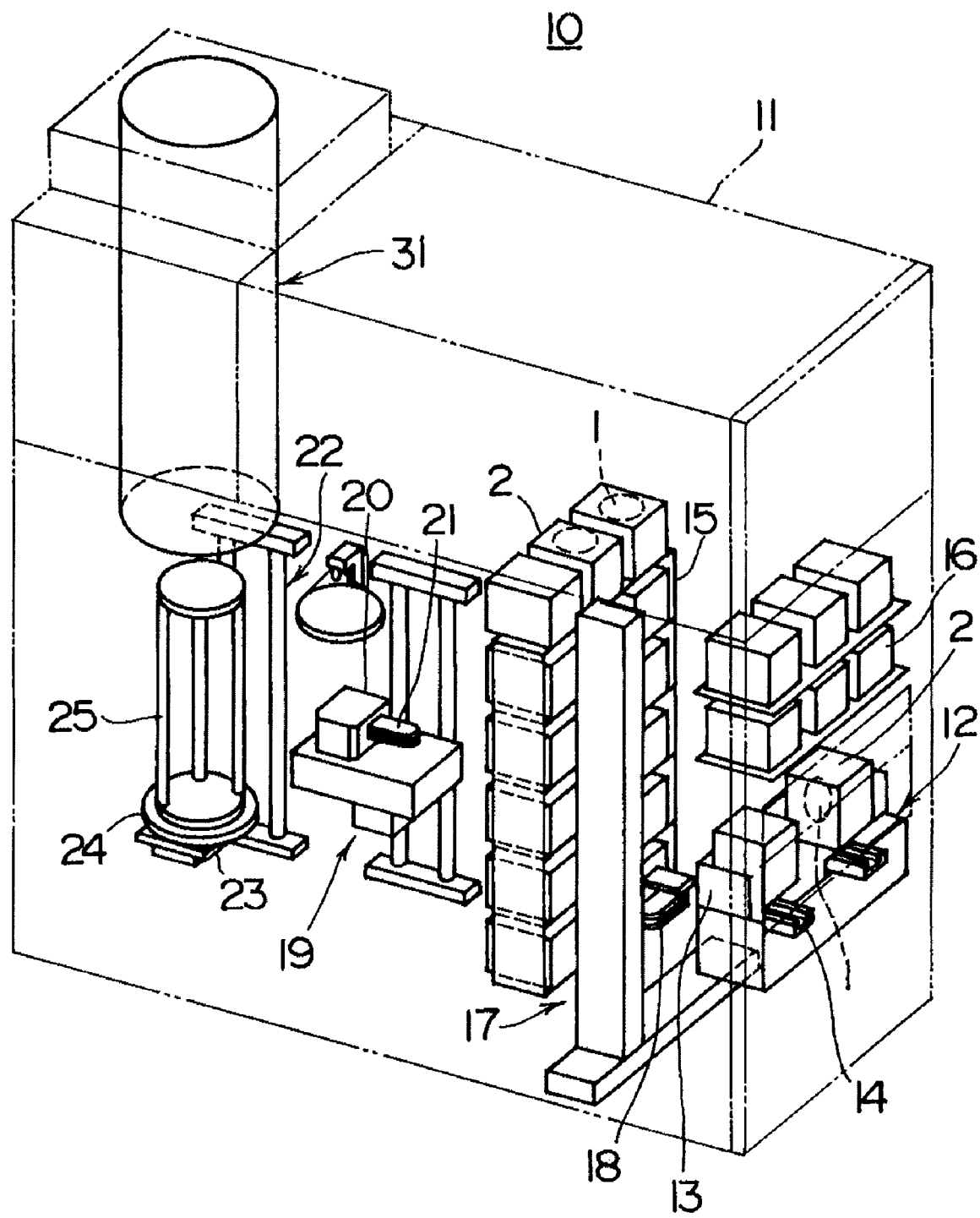
FIG. 1 is a schematic perspective view of a substrate processing apparatus relevant to an embodiment of the present invention.

As shown in FIG. 1, the ALD apparatus 10 relevant to the current embodiment includes a housing 11, and a cassette delivery unit 12 is installed at the front side of the housing 11. The cassette delivery unit 12 includes a cassette stage 13 can accommodate two cassettes 2 used as wafer carriers. The cassette stage 13 rotates 90 degrees to place the cassettes 2 at a horizontal position.

Two wafer position matching devices 14 are installed under the cassette stage 13.

The cassettes 2 are transferred to the cassette stage 13 by an external transfer device (not shown). The cassettes 2 transferred by the external transfer device are placed on the cassette stage 13 at a vertical position (a state that the wafers 1 accommodated in the cassettes 2 are placed vertically).

The wafer position matching devices 14 match the positions of the wafers 1 accommodated in the cassettes 2 so that notches or orientation flats of the wafers 1 are arranged in the same direction.

Inside the housing 11, a cassette shelf 15 is installed to face the cassette delivery unit 12, and a standby cassette shelf 16 is installed above the cassette delivery unit 12.

A cassette transfer device 17 is installed between the cassette delivery unit 12 and the cassette shelf 15. The cassette transfer device 17 includes a robot arm 18 which can advance or retreat in a forward or backward direction, and the robot arm 18 is designed to move transversely and elevate upward and downward.

The robot arm 18 transfers the cassettes 2 placed on the cassette stage 13 at the horizontal position toward the cassette shelf 15 or the standby cassette shelf 16 in cooperation with the advance, retreat and transverse movements.

At the rear side of the cassette shelf 15, a wafer transfer device 19 is installed. The wafer transfer device 19 is designed to be rotatable and elevatable. The wafer transfer device 19 transfers a plurality of wafers 1 in a batch manner. The wafer transfer device 19 includes a wafer holing unit 20 which can advance and retreat, and a plurality of wafer holding plates 21 are horizontally installed in the wafer holding unit 20.

The wafer transfer device 19 may be designed to transfer the wafers 1 one by one.

At the rear side of the wafer transfer device 19, a boat elevator 22 is installed so that it elevates a boat 25 where a plurality of wafers 1 are held.

On an arm 23 of the boat elevator 22, the boat 25 is horizontally installed via a seal cap 24.

Figure 2:
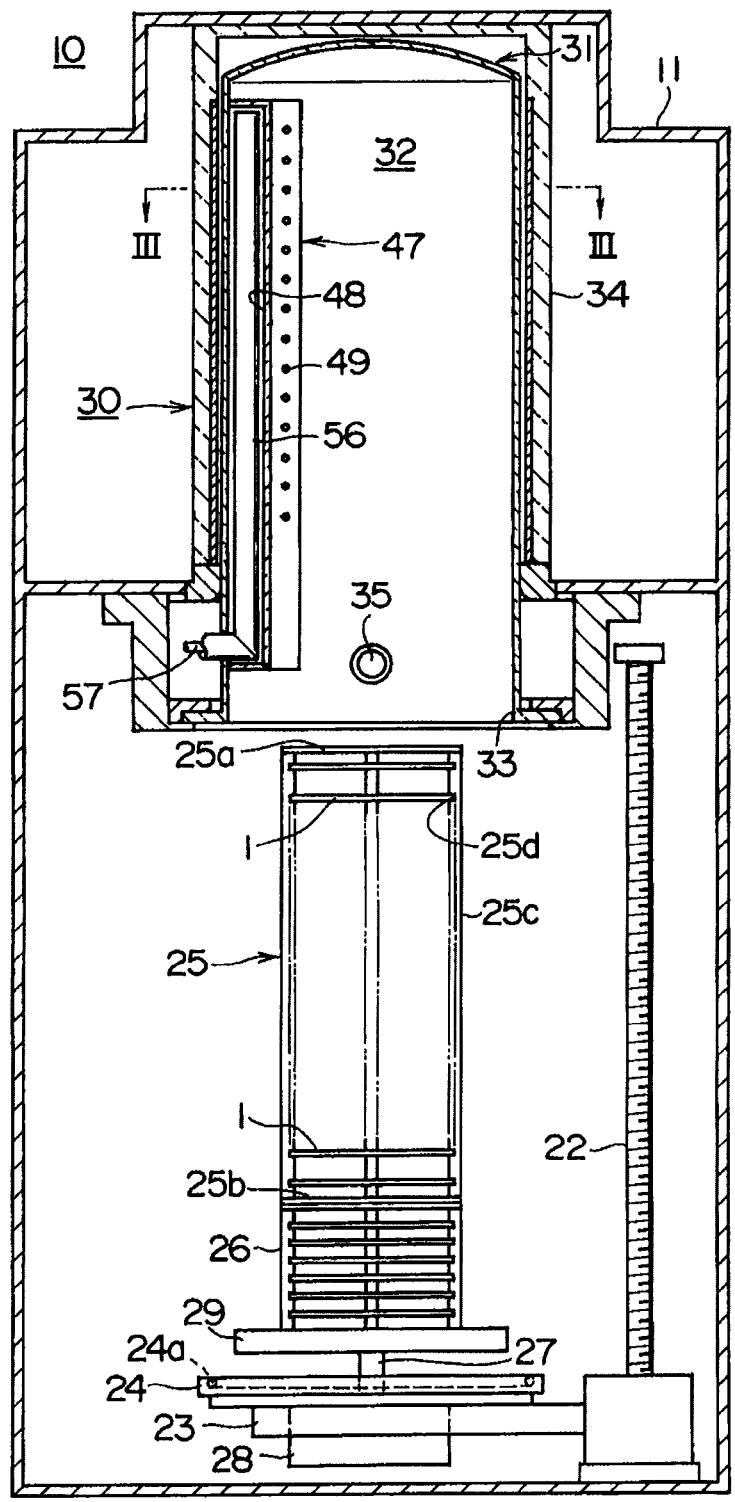
FIG. 2 is a front sectional view illustrating main parts of the ALD apparatus.

As shown in FIG. 2, the seal cap 24 has a disk shape having an outer diameter greater than an inner diameter of a furnace throat 33 of a process tube 31. The seal cap 24 contacts the bottom surface of the process tube 31 via a seal ring 24a, so that the furnace throat 33 of the process tube 31 is closed.

On the centerline of the seal cap 24, the boat 25 vertically stands and is supported via an insulating cap 26.

On the centerline of the seal cap 24, a rotation shaft 27 is inserted. The rotation shaft 27 elevates with the seal cap 24 and also is rotated by a rotation driving device 28. A support plate 29 is horizontally fixed on the rotation shaft 27, and the boat 25 is installed on the support plate 29 so that it vertically stands and is supported via the insulating cap 26.

The boat 25 includes a pair of end plates 25a and 25b, and a plurality of holding members 25c (three holding members are used in the current embodiment) arranged vertically between the end plates 25a and 25b. At each of the holding members 25c, a plurality of pairs of holders 25d are arranged at regular intervals in a longitudinal direction, and are recessed so that they are opened to face one another within the same plane.

As the outer periphery parts of the wafers 1 are inserted into the plurality of pairs of the holders 25d of the holding members 25c, the plurality of wafers 1 are arranged and supported inside the boat 25 at a horizontal position, with their centers aligned.

Figure 3:
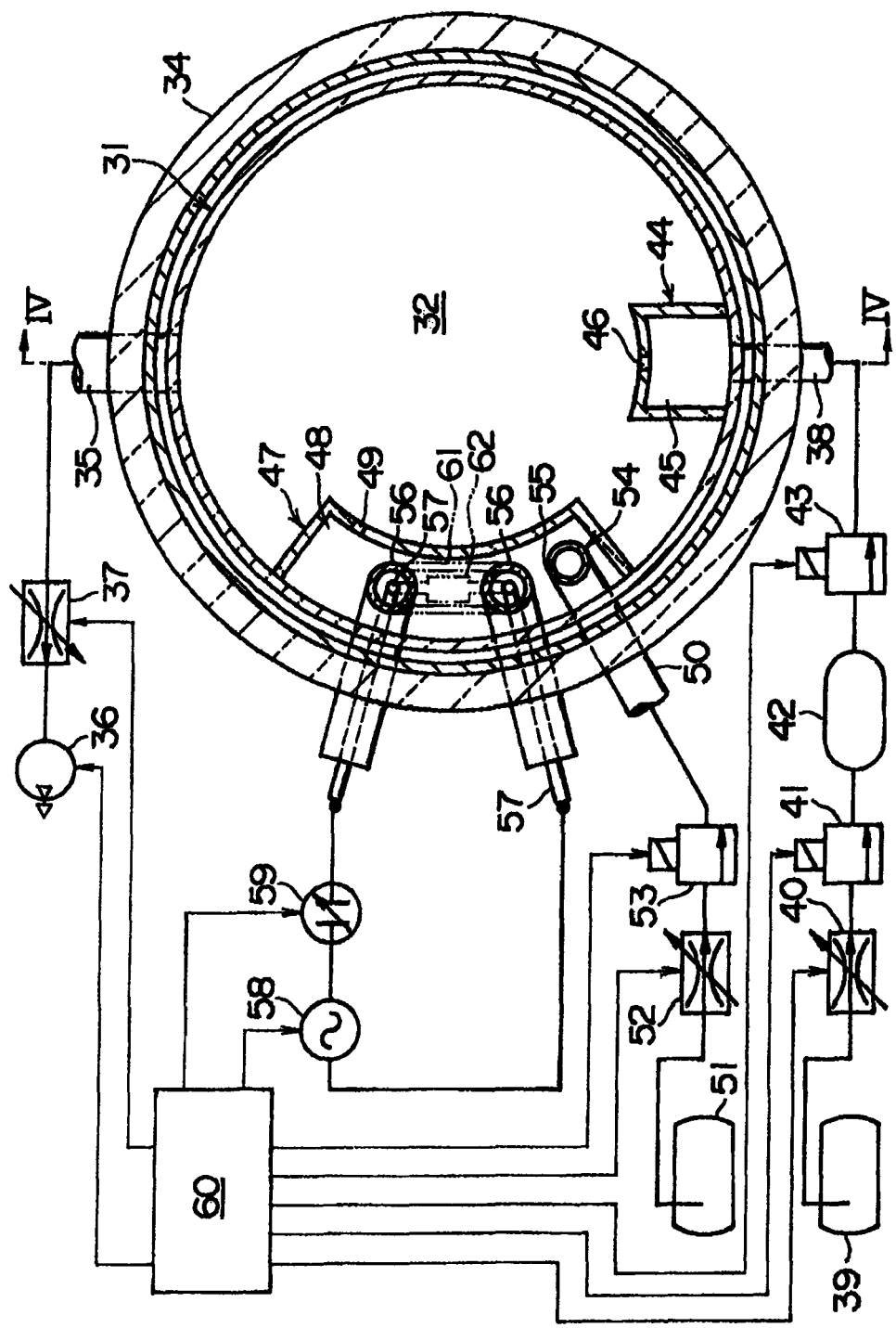
FIG. 3 is a plan sectional view showing circuit diagram along line III-III of FIG. 2.
Figure 4:
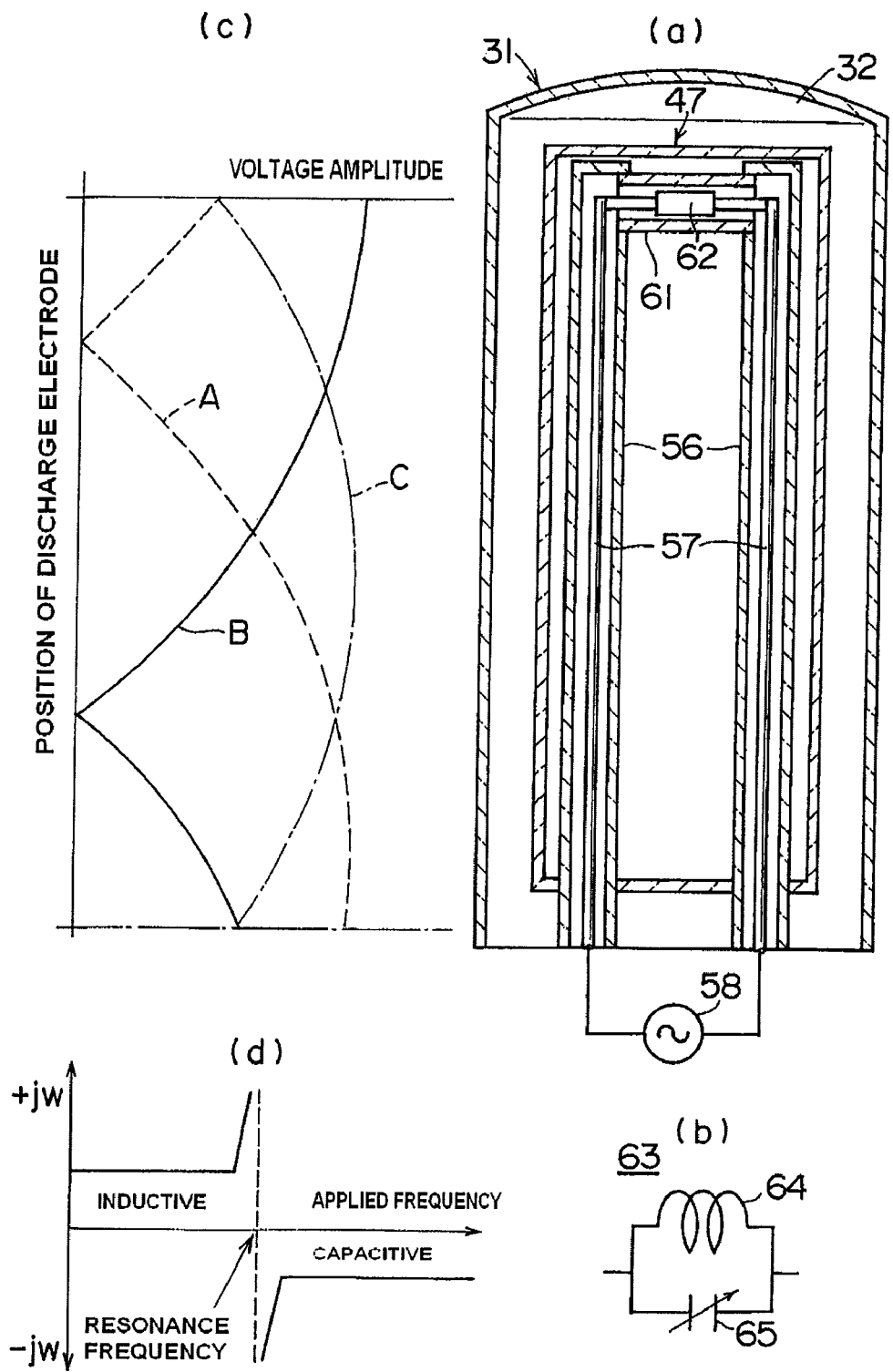
FIG. 4A is a side sectional view showing an impedance element.
FIG. 4B is an equivalent circuit diagram of a variable impedance element.
FIG. 4C is a graph showing a voltage distribution.
FIG. 4D is a graph showing an impedance variation with respect to a frequency of a parallel resonance circuit.

As shown in FIG. 2 to FIG. 4, the ALD apparatus 10 includes a process furnace 30, and the process furnace 30 includes a process tube 31. The process tube 31 is made of quartz (SiO$_2$) in an integrated form. The process tube 31 is formed in a cylindrical shape so that one end is opened and the other end is closed. The process tube 31 is longitudinally installed so that its centerline becomes vertical, and is fixedly supported.

The cylindrical hollow part of the process tube 31 defines a process chamber 32 which accommodates and processes the plurality of wafers 1. A lower opening of the process tube 31 forms a furnace throat 33 through which the wafers 1 enters and exits. The inner diameter of the process tube 31 is set to be larger than the maximum outer diameter of the wafer 1 to be treated.

At the outside of the process tube 31, a heater unit 34 is installed concentrically to surround the process tube 31. The heater unit 34 heats the whole process chamber 32 at a uniform temperature distribution or a predetermined temperature distribution.

The heater unit 34 is supported to the housing 11 of the ALD apparatus 10 so that it is vertically fixed.

One end of an exhaust pipe 35 is connected to a part of the sidewall of the process tube 31 near the furnace throat 33. As shown in FIG. 3, the other end of the exhaust pipe 35 is connected to a vacuum pump 36 via a variable flow rate control valve 37. The exhaust pipe 35 vacuum-exhausts the process chamber 32.

The variable flow rate control valve 37 controls pressure of the process chamber 32 by controlling exhaust volume through the adjustment of opening of the valve.

At the process tube 31, one end of a gas supply pipe 38 is connected at an about 180-degree opposite position to the exhaust pipe 35 installed at the sidewall near the furnace throat 33. As shown in FIG. 3, the other end of the gas supply pipe 38 is connected to a gas supply source 39. The gas supply source 39 supplies a predetermined gas species in the ALD method. A variable flow rate control valve 40, an upstream on-off valve 41, a gas tank 42 and a downstream on-off valve 43 are installed sequentially from the gas supply source 39 to the gas supply pipe 38.

At the process tube 31, a partition wall 44 having an approximately quadrate tubular shape is disposed in a region facing the gas supply pipe 38. The partition wall 44 is disposed in parallel to the inner periphery of the process tube 31 in a vertical direction. The partition wall 44 defines a gas supply chamber 45.

As shown in FIG. 4, a plurality of blowout openings 46 are formed at the partition wall 44, and the blowout openings 46 are faced between the wafers 1 which are vertically adjacent within the boat 25. The blowout openings 46 uniformly blow out the gas supplied to the gas supply chamber 45.

When the differential pressure between the gas supply chamber 45 and the process chamber 32 is small, it is preferable that the blowout openings 46 have the same opening area and are arranged at the same opening pitch from the upstream side toward the downstream side.

However, when the differential pressure between the gas supply chamber 45 and the process chamber 32 is large, it is preferable that the blowout opening 46 has the increasing opening area from the upstream side to the downstream side, or are arranged at the smaller opening pitch from the upstream side toward the downstream side.

At the process tube 31, the partition wall 47 having the approximately quadrate tubular shape is disposed at a position spaced apart about 90 degrees from the exhaust pipe 35 installed at the sidewall near the furnace throat 33, and the partition wall 47 also is disposed in parallel to the inner periphery of the process tube 31 in a vertical direction. The partition wall 47 (hereinafter, referred to as a plasma chamber wall) defines a plasma chamber 48.

As shown in FIG. 3, at the plasma chamber wall 47, the inward sidewall has an arc-shaped cross section, and the circumferential width is about 60 degrees. At the plasma chamber wall 47, a plurality of blowout openings 49 are formed at the end part of the exhaust pipe 35 of the inward sidewall, and the plurality of blowout openings 49 are faced between the wafers 1 which are vertically adjacent within the boat 25. The blowout openings 49 uniformly blow out the gas supplied to the plasma chamber 48.

The phase difference between the blowout opening 49 of the plasma chamber wall 47 and the blowout opening 46 of the partition wall 44 defining the gas supply chamber 45 is set to about 120 degrees.

When the differential pressure between the plasma chamber 48 and the process chamber 32 is small, it is preferable that the blowout openings 49 of the plasma chamber wall 47 have the same opening area and are arranged at the same opening pitch from the upstream side toward the downstream side.

However, when the differential pressure between the plasma chamber 48 and the process chamber 32 is large, it is preferable that the blowout opening 49 has the increasing opening area from the upstream side to the downstream side, or are arranged at the smaller opening pitch from the upstream side toward the downstream side.

At the process tube 31, one end of a gas supply pipe 50 is connected at an opposite position to the blowout opening 49 disposed at the sidewall near the furnace throat 33. The other end of the gas supply pipe 50 is connected to a gas supply source 51, and the gas supply source 51 supplies a predetermined gas species in the ALD method.

A variable flow rate control valve 52 and an on-off valve 53 are installed sequentially from the gas supply source 51 to the gas supply pipe 50.

At the gas supply pipe 50, one end of a nozzle 54 is connected to the inner end of the plasma chamber wall 47, and the nozzle 54 stands vertically. At the nozzle 54, a plurality of gas supply holes 55 are arranged at regular intervals in a vertically direction and are formed inwardly in a circumferential direction.

At the inside of the plasma chamber 48, a pair of protecting pipes 56 are adjacently installed in a vertical direction. The pair of the protecting pipes 56 are symmetrically installed at opposite sides with respect to the centerline of the plasma chamber 48.

Each of the protecting pipes 56 is made of a dielectric material and has an elongated circular pipe shape, and its upper end is closed. A lower end of each of the protecting pipes 56 is properly curved and passes through the sidewall of the process tube 31 and protrudes to the outside.

The hollow part of each of the protecting pipes 56 communicates with the outside (atmospheric pressure) of the process chamber 32.

At the two protecting pipes 56, a pair of discharge electrodes 57 is installed concentrically inside the hollow part.

The two discharge electrodes are made of a conductive material and have an elongated rod shape.

A high-frequency power source 58 applying a high-frequency power is electrically connected between the two discharge electrodes 57 via a matching device 59.

The high-frequency power source 58 and the matching device 59 are controlled by a controller 60.

The controller 60 controls the variable flow rate control valves 37, 40 and 52 or the on-off valves 41, 43 and 53 and the heater unit 34.

As shown in FIG. 4A, a mounting pipe 61 is connected between the upper ends of the two protecting pipes 56, and the mounting pipe 61 is air-tightly sealed. At the inside of the mounting pipe 61, a variable impedance element 62 is installed. Both ends of the variable impedance element 62 are electrically connected to the high-frequency power source 58 of the two discharge electrodes 57.

The variable impedance element 62 is configured by a parallel resonance circuit 63 shown in FIG. 4(B). The parallel resonance circuit 63 includes a coil 64 and a variable condenser 65 arranged in parallel, and both ends of the parallel resonance circuit 63 are connected in series to the two discharge electrodes 57. Due to such a shorted configuration, a reflecting phase angle can be changed. At this point, an overlapping phase of a traveling wave and a reflected wave is changed.

Explanation will be given on a film forming process in an IC fabrication method using the ALD apparatus 10 having the above-described structure.

First, a whole operation of the substrate processing apparatus will be described.

As shown in FIG. 2, a plurality of wafers 1 as substrates to be processed in the ALD apparatus 10 are charged into the boat 25 by the wafer transfer device 19.

The boat 25 charged with the plurality of wafers 1 is moved upward by the boat elevator 22, together with the seal cap 24 and the rotation shaft 27, and is loaded into the process chamber 32 of the process tube 31.

Figure 5:
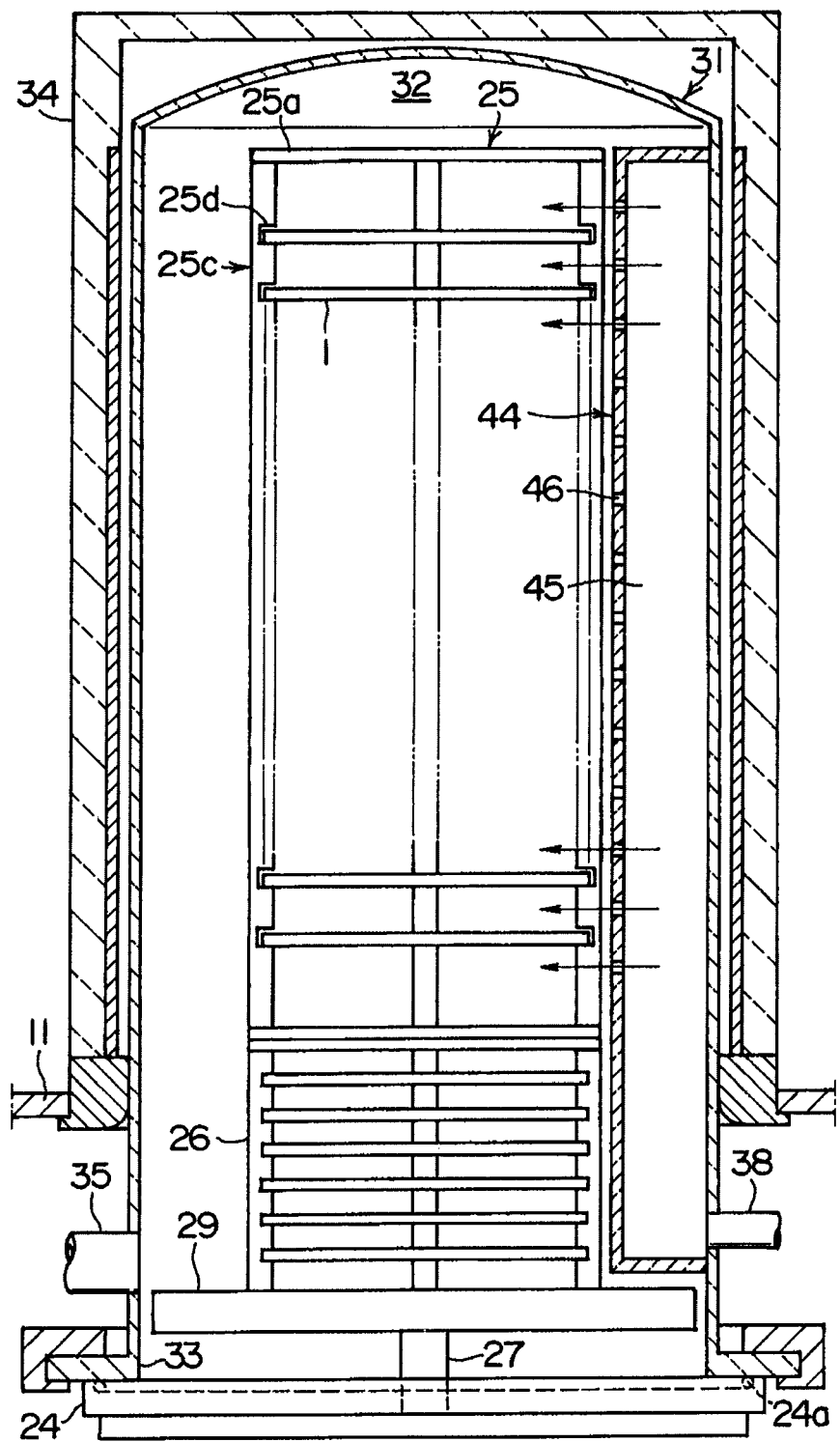
FIG. 5 is a side sectional view showing a film process.

As shown in FIG. 5, when the boat 25 holding a group of the wafers 1 is loaded into the process chamber 32 and thus the process chamber 32 is sealed by the seal cap 24, the process chamber 32 is exhausted to below a predetermined pressure by the vacuum pump 36 connected to the exhaust pipe 35, and power supplied to the heater unit 34 is increased, so that temperature of the process chamber 32 is increased to a predetermined level.

Since the heater unit 34 has a hot wall type structure, the temperature of the process chamber 32 is uniformly maintained all over, so that the temperature distribution of the group of the wafers 1 held in the boat 25 is uniform in entirety and simultaneously the temperature distribution of the surface of each wafer 1 is also uniform and equal.

After the temperature of the process chamber 32 reaches a preset value and thus becomes stable, the film forming process using the ALD method to be described below is performed.

When a predetermined film forming process is completed, the seal cap 24 is moved downward by the boat elevator 22, and the furnace throat 33 is opened and the group of the wafers 1 held in the boat 25 is unloaded through the furnace throat 33 to the outside of the process chamber 32.

The group of the wafers 1 unloaded to the outside of the process chamber 32 is discharged from the boat 25 by the wafer transfer apparatus 19.

By repeating the above operations, a plurality of wafers 1 are batch-processed.

Next, explanation will be given on the film forming process using the ALD method when a silicon nitride film is formed by using dichlorosilane gas and ammonia gas.

In case where the silicon nitride film is formed by using the dichlorosilane gas and the ammonia gas, the following first step, second step and third step are sequentially performed.

In the first step, the ammonia gas requiring plasma excitation and the dichlorosilane gas requiring no plasma excitation are supplied together.

Figure 6:
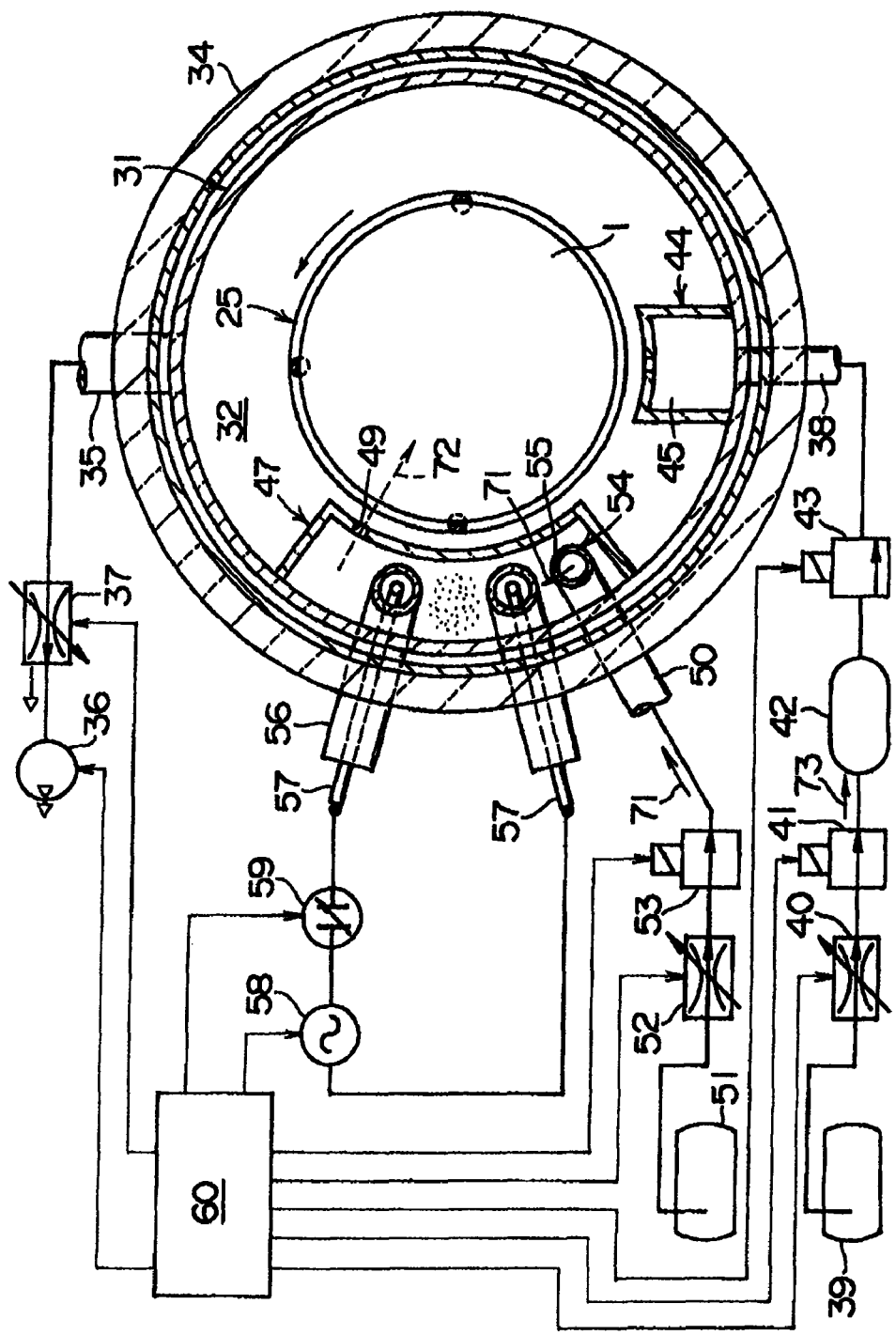
FIG. 6 is a plan sectional view including a circuit diagram showing a first step of an ALD method.

As shown in FIG. 6, the on-off valve 53 installed in the gas supply pipe 50 and the variable flow rate control valve 37 installed in the exhaust pipe 35 are all opened. The ammonia gas 71 supplied from the gas supply pipe 50 and having the flow rate controlled by the variable flow rate control valve 52 is sprayed into the plasma chamber 48 through the gas supply hole 55 of the nozzle 54.

Furthermore, the high-frequency power from the high-frequency power source 58 is applied between the pair of the discharge electrodes 57 through the matching device 59. As the ammonia gas 71 sprayed into the plasma chamber 48 is plasma-excited, it is supplied into the process chamber 32 as the active species 72 and is exhausted through the exhaust pipe 35.

When the ammonia gas 71 is plasma-excited and supplied into the process chamber 32 as the active species and then exhausted, the pressure of the process chamber 32 is set to 10-100 Pa by properly adjusting the variable flow rate control valve 37.

The supply flow rate of the ammonia gas 71 controlled by the variable flow rate control valve 52 is 1000-10000 sccm.

The exposure time of the wafer 1 to the active species 72 obtained by the plasma excitation of the ammonia gas 71 is 2-120 seconds. In this case, the control temperature of the heater unit 34 is set so that the temperature of the wafer becomes 300-600° C. Since the reaction temperature of the ammonia gas 71 is high, it does not react at the temperature of the wafer (300-600° C.). Therefore, by plasma-exciting the ammonia gas 71 and supplying it as the active species 72, the ammonia gas 71 can be deposited on the wafer 1 even though the wafer 1 is in a low temperature range.

When the ammonia gas 71 is plasma-excited and supplied into the process chamber 32 as the active species 72, as shown in FIG. 6, the upstream on-off valve 41 of the gas supply pipe 38 is opened and the downstream on-off valve 43 is closed, so that the dichlorosilane gas 73 requiring no plasma excitation flows to the gas tank 42. Therefore, the dichlorosilane gas 73 is stored in the gas tank 42 installed between the upstream on-off valve 41 and the downstream on-off valve 43.

In this case, the gas flowing inside the process chamber 32 is the active species 72 obtained by the plasma excitation of the ammonia gas 71, and the dichlorosilane gas 73 does not exist inside the process chamber 32. Thus, the ammonia gas 71 does not make vapor phase reaction, and the ammonia gas 71 which is supplied as the active species 72 by the plasma excitation makes the surface reaction with a base film on the wafer 1.

Figure 7:
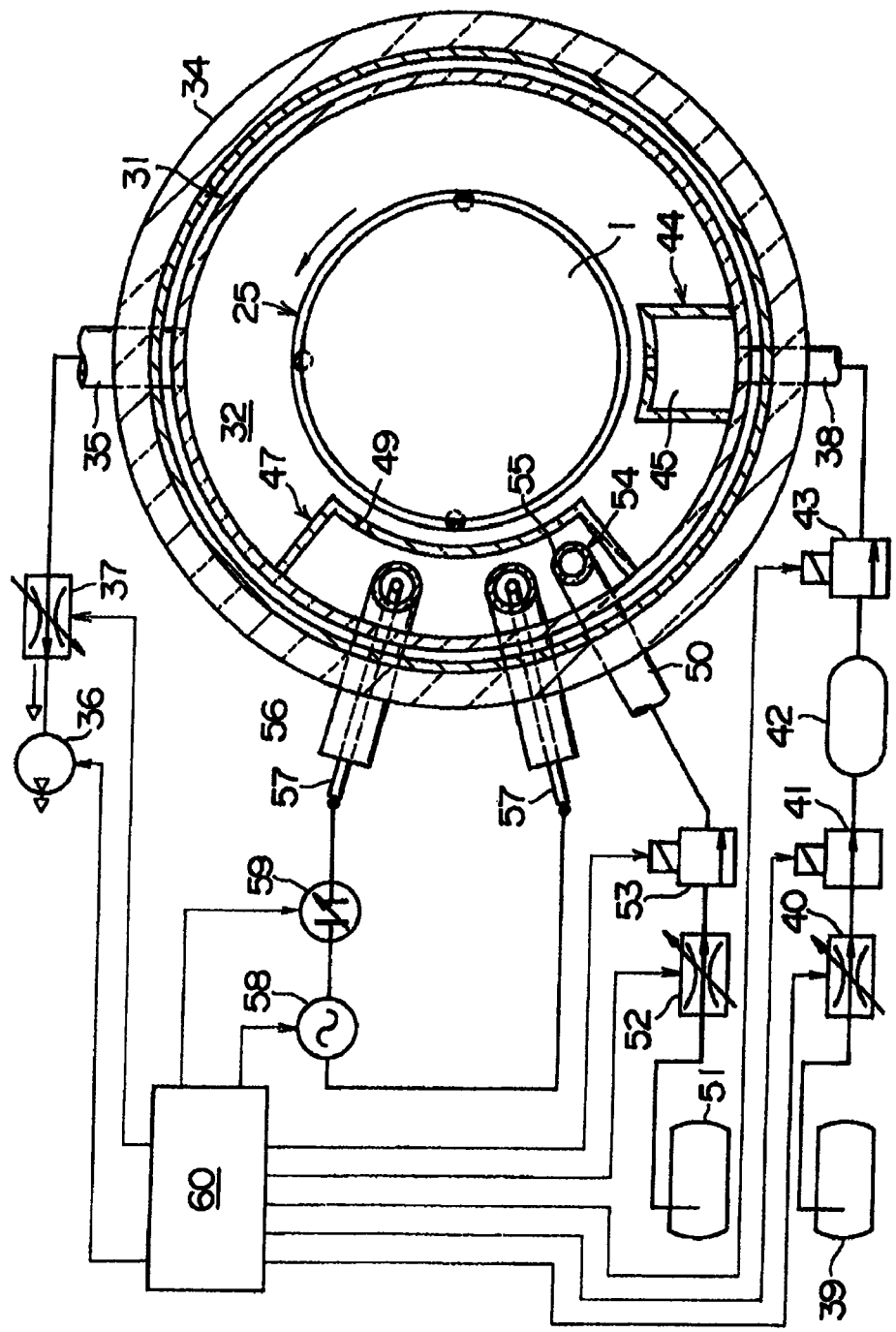
FIG. 7 is a plan sectional view including a circuit diagram showing a second step of the ALD method.

In the second step, as shown in FIG. 7, the on-off valve 53 of the gas supply pipe 50 is closed so that the supply of the ammonia gas 71 is stopped.

Meanwhile, the dichlorosilane gas 73 continues to be supplied to the gas tank 42. When a predetermined amount of the dichlorosilane gas 73 is stored in the gas tank 42 at a predetermined pressure, the upstream on-off valve 41 is closed (see FIG. 3). Thus, the dichlorosilane gas 73 is stored in the gas tank 42 until the pressure becomes more than 20000 Pa.

Furthermore, the variable flow rate control valve 40, the on-off valves 41 and 43 and the variable flow rate control valve 37 are controlled by the controller 60 so that the conductance between the gas tank 42 and the process chamber 32 becomes more than $1.5 \times 10^{-3}$ m³/s.

Moreover, considering the ratio of the volume of the process chamber 32 to the necessary volume of the gas tank 42, when the volume of the process chamber 32 is 100 l, it is preferable that the volume of the gas tank 42 is 100-300 cc. Also, in view of the volume ratio, it is preferable that the gas tank 42 is 1/1000-3/1000 times the volume of the process chamber 32.

Therefore, as shown in FIG. 7, by maintaining the variable flow rate control valve 37 of the exhaust pipe 35 in an opened state and exhausting the process chamber 32 to below 20 Pa by the vacuum pump 36, the remaining ammonia gas 71 is removed from the process chamber 32. In this case, if inert gas such as nitrogen gas is supplied into the process chamber 32, the remaining ammonia gas 71 can be more effectively removed from the process chamber 32.

Figure 8:
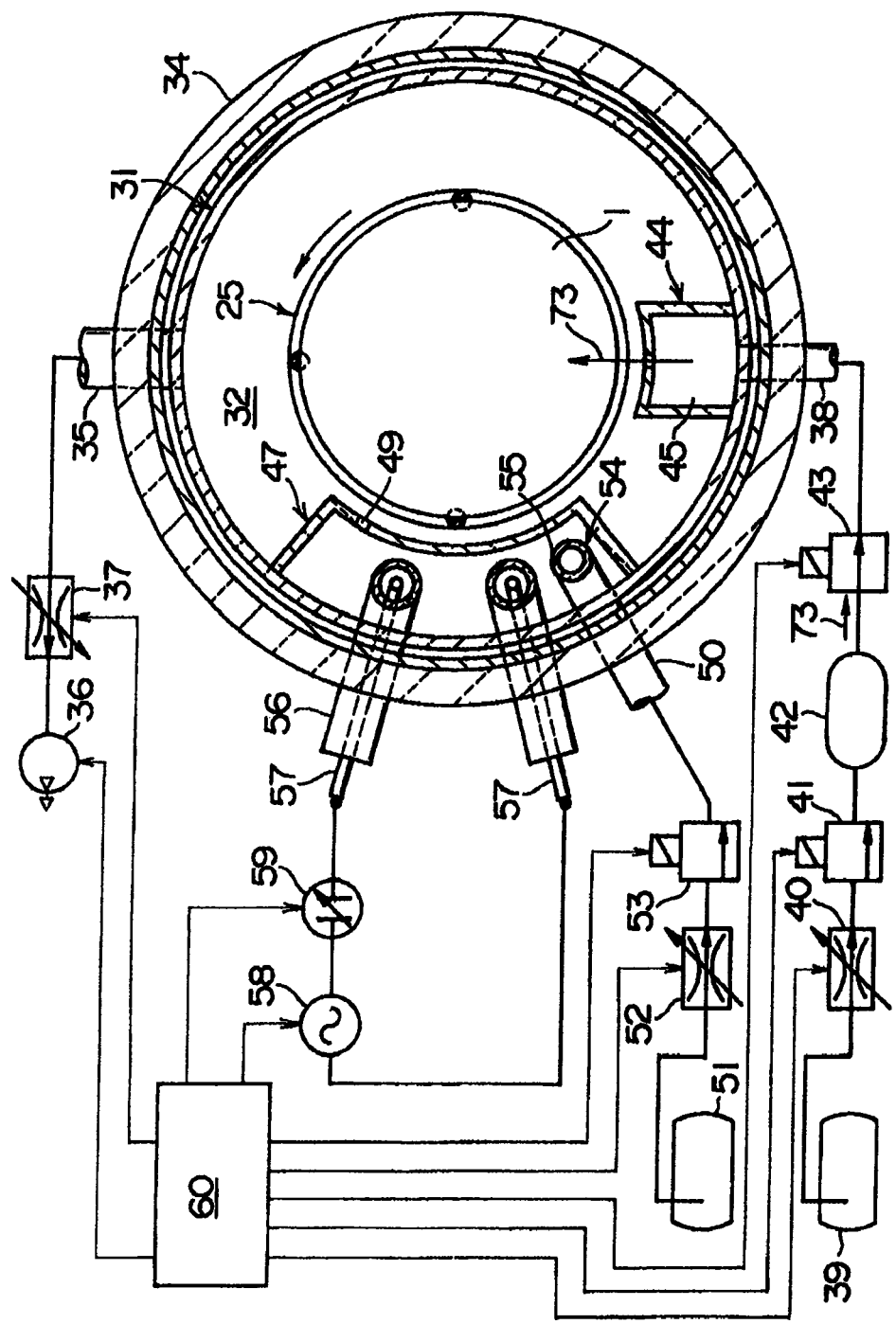
FIG. 8 is a plan sectional view including a circuit diagram showing a third step of the ALD method.

In the third step, as shown in FIG. 8, when the exhaust of the process chamber 32 is completed, the variable flow rate control valve 37 of the exhaust pipe 35 is closed so that the exhaust is stopped, and simultaneously the downstream on-off valve 43 of the gas supply pipe 38 is opened. Thus, the dichlorosilane gas 73 stored in the gas tank 42 is supplied into the process chamber 32 at a time. In this case, since the variable flow rate control valve 37 of the exhaust pipe 35 is closed, the pressure inside the process chamber 32 is rapidly increased up to about 931 Pa (7 Torr).

The supply time of the dichlorosilane gas 73 is set to 2-4 seconds, and the exposure time to the increased pressure environment is set to 2-4 seconds, so that a total time becomes 6 seconds. In this case, the temperature of the wafer is 300-600° C. like in the case of supplying the ammonia gas 71.

Due to the supply of the dichlorosilane gas 73, the surface reaction occurs between the ammonia gas 71 and the dichlorosilane gas 73 on the base layer of the wafer 1, and the silicon nitride film is formed on the wafer 1.

Although not shown, after the film formation, the downstream on-off valve 43 is closed and simultaneously the variable flow rate control valve 37 is opened. Thus, the process chamber 32 is vacuum-exhausted, and the dichlorosilane gas 73 remaining after contributing to the film formation is removed. At this point, if the inert gas such as the nitrogen gas is supplied into the process chamber 32, the dichlorosilane gas 73 remaining after contributing to the film formation can be more effectively removed from the process chamber 32.

Therefore, the upstream on-off valve 41 is opened, and the supply of the dichlorosilane gas 73 to the gas tank 42 in the first step is started.

The first step to third step are set as 1 cycle, and such a cycle is repeated a plurality of times to form the silicon nitride film on the wafer 1 to a predetermined thickness.

In the ALD method, source gas is adsorbed onto the surface of the base layer. An adsorbed amount of the source gas is proportional to the pressure of the source gas and the exposure time of the source gas. Therefore, in order to adsorb a desired amount of the source gas in a short time, it is necessary to raise the pressure of the source gas in a short time.

In the current embodiment, since the variable flow rate control valve 37 is closed and then the dichlorosilane gas 73 stored in the gas tank 42 is instantaneously supplied to the process chamber 32, the pressure of the dichlorosilane gas 73 in the process chamber 32 can be rapidly raised, and a desired amount of the dichlorosilane gas 73 can be instantaneously adsorbed.

Furthermore, in the current embodiment, a special step (time) for storing the dichlorosilane gas 73 in the gas tank 42 is not required. This is because the dichlorosilane gas 73 is stored in the gas tank 42 during the time when the ammonia gas 71 is plasma-excited and supplied as the active species 72 and the process chamber 32 is exhausted.

Furthermore, since the ammonia gas 71 is removed by exhausting the inside of the process chamber 32 and then the dichlorosilane gas 73 is supplied into the process chamber 32, the ammonia gas 71 and the dichlorosilane gas 73 does not react with each other in the course of flowing toward the wafer 1. That is, the dichlorosilane gas 73 supplied into the process chamber 32 effectively reacts with only the ammonia gas 71 which is previously adsorbed onto the wafer 1.

Figure 9:
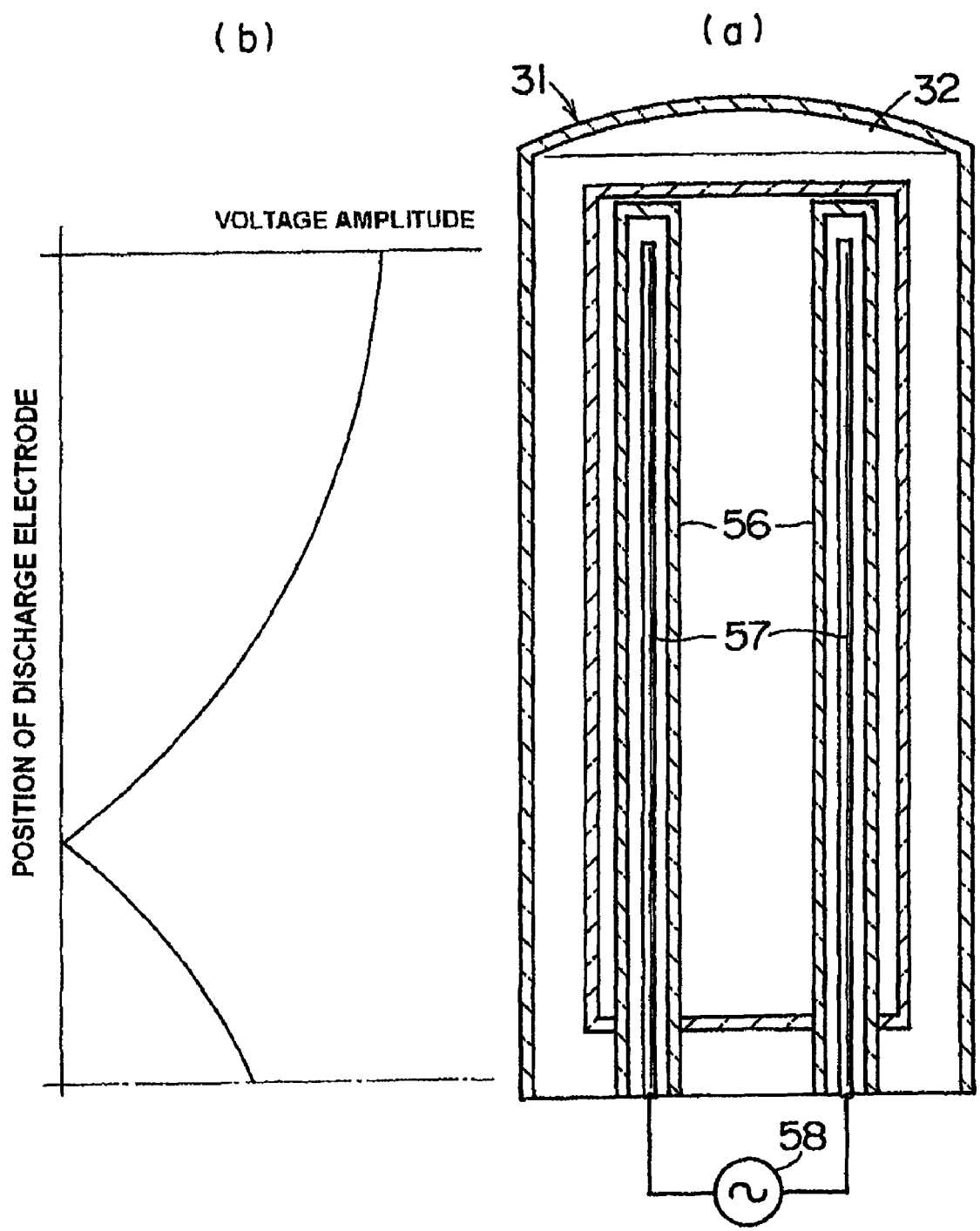
FIG. 9A is a side sectional view showing an impedance element of a comparative example.
FIG. 9B is a graph showing a voltage distribution of the comparative example.

However, as shown in FIG. 9A, when one end of each of the pair of the discharge electrodes 57 is opened, it is not matched with the impedance of the electrical line. Thus, as shown in FIG. 9B, the voltage standing wave is generated. For this reason, the voltage amplitude is large at the front ends of the pair of the discharge electrodes 57 and is decreasing as closer to the high-frequency power source 58, and becomes a minimum value at any point and then again increases.

Since the difference of the voltage amplitude according to the position of the pair of the discharge electrodes 57 causes the plasma intensity to be varied according to the position, the plurality of stacked wafers cannot be uniformly processed in the above-mentioned ALD method.

In the ALD apparatus 10 relevant to the current embodiment, since the impedance is changed by the variable impedance element 62 connected between the upper ends of the pair of the discharge electrodes 57, the voltage distribution can be changed to the curves A-B-C shown in FIG. 4C by changing the output frequency of the high-frequency power source 58.

By changing the output frequency of the high-frequency power source 58 during the plasma discharge, the local minimum point of the voltage distribution is shifted. In this way, the plasma generation amount within the pair of the discharge electrodes 57 can be uniformized. Preferably, the output frequency keeps being changed during the plasma discharge.

Furthermore, the variation rate of the output frequency can be electrically changed. The variation amount of the output frequency is determined according to the balance with the coil 64.

Explanation will be given on the case where the output frequency of the high-frequency power source 58 is equal to the parallel resonance frequency of the variable impedance element 62.

In this case, since the variable impedance element 62 parallel-resonates and becomes high impedance, the voltage distribution is represented by the solid-line curve B of FIG. 4C. The voltage distribution of this case is equal to that of the case where the variable impedance element 62 is not connected between the pair of the discharge electrodes 57 (see FIG. 9).

Next, explanation will be given on the case where the output frequency of the high-frequency power source 58 is lower than the parallel resonance frequency of the variable impedance element 62.

In this case, since the variable impedance element 62 becomes inductive (see FIG. 4D), the voltage distribution is represented by the dot-dashed-line curve of FIG. 4C.

Next, explanation will be given on the case where the output frequency of the high-frequency power source 58 is higher than the parallel resonance frequency of the variable impedance element 62.

In this case, since the variable impedance element 62 becomes capacitive (see FIG. 4D), the voltage distribution is represented by the dashed-line curve A of FIG. 4C.

Although any output frequency is applicable, it is particularly effective to a vertical type apparatus when the length of the substrate region (total boat length) is less than ½ wavelength in view of the substrate stacking direction. If the frequency increases, the plasma density increases but the wavelength becomes short, which will degrade the processing uniformity between the substrates.

The detailed description will be made below.

In the case where the substrate region length (total boat length) is greater than ½ wavelength in view of the substrate stacking direction, since the difference of the voltage amplitude within the substrate region (total boat length) is small, the plasma generation amount within the pair of the discharge electrodes can be uniformized by moving the local minimum point of the voltage distribution at the outside of the substrate region (the flat part of the wave is allocated to the substrate region).

$\lambda=c/f$ where $\lambda$ is the wavelength, c is the light speed ($=3\times 10^3$), and f is the frequency. For example, if the frequency (f) is 13.56 MHz, the wavelength ($\lambda$) is 22.1 m. Thus, ½ wavelength ($\lambda$) is 11.1 m, and ¼ wavelength ($\lambda$) is 5.5 m. If the substrate region length (total boat length) is less than 11.1 m in view of the substrate stacking direction, the uniform processing can be achieved without changing the output frequency.

Next, in the case where the substrate region length (total boat length) is less than ½ wavelength in view of the substrate stacking direction, the plasma generation amount within the pair of the discharge electrodes can be uniformized by moving the local minimum point of the voltage distribution through the variation of the output frequency during the plasma generation.

For example, if the frequency (f) is 27.12 MHz, the wavelength ($\lambda$) is 11.1 m, ½ wavelength ($\lambda$) is 5.5 m, and ¼ wavelength ($\lambda$) is 2.8 m. Furthermore, if the frequency (f) is 40.68 MHz, the wavelength ($\lambda$) is 7.4 m, ½ wavelength ($\lambda$) is 3.7 m, and ¼ wavelength ($\lambda$) is 1.8 m. Thus, when the substrate region length (total boat length) in the substrate stacking direction is less than 5.5 m if the output frequency used is 27.12 MHz and the substrate region length is less than 3.7 m if the output frequency used is 40.68 MHz, the plasma generation amount within the pair of the discharge electrodes can be uniformized by continuing to move the local minimum point of the voltage distribution during the plasma generation.

According to the above-described embodiments, the processing non-uniformity can be prevented because the difference of the plasma distribution according to the locations is prevented by changing the voltage distribution within a pair of electrodes.

According to the above-described embodiments, the following effects can be obtained.

1) By connecting the variable impedance element between the open ends of a pair of discharge electrodes, it is possible to change the output frequency of the high-frequency and move the local minimum point of the voltage distribution during the plasma discharge. Thus, the plasma generation amount within the pair of the discharge electrodes can be uniformized.

2) By uniformizing the plasma generation amount within the pair of the discharge electrodes, the processing non-uniformity between the wafers stacked in the boat is suppressed. Thus, the plasma processing can be uniformized over the total boat length.

3) By uniformizing the plasma processing over the total boat length, the yield of the IC fabrication method, in addition to the ALD method by the ALD apparatus, can be improved. Furthermore, the IC quality and reliability can be improved.

4) Furthermore, by uniformizing the plasma processing over the total boat length, the ALD apparatus can achieve the stable process at a low temperature.

The present invention is not limited to the above-described embodiments, and it is obvious that various changes can be made without departing from the scope of the invention.

For example, the variable impedance element is not limited to the constitution configured by the variable condenser and the coil.

Although it has been described in the above-described embodiment that the silicon nitride film is formed appropriately and precisely at a low temperature by supplying dichlorosilane and ammonia alternately, the ALD apparatus can be applied to the case of removing carbon from $Ta_2O_5$ film of the static capacitance part of the capacitor, the case of removing foreign particles from other films (molecules or atoms except for the films, and the case of forming, diffusing or thermally treating an ALD film on the wafer.

For example, in performing a nitration process on an oxide film for a gate electrode of a DRAM as one example of IC, the surface of the oxide film can be nitrated by supplying nitrogen gas or ammonia gas or nitrous oxide ($N_2O$) to the gas supply pipe and heating the process chamber to room temperature to 750° C.

Furthermore, before forming a silicon germanium (SiGe) film, the surface of the silicon wafer is plasma processed by the active particles of hydrogen ($H_2$) gas. Thus, a natural oxide film can be removed, and a desired SiGe film can be formed.

Moreover, although the ALD apparatus has been described in the above-described embodiments, the present invention is not limited to the ALD apparatus, but can be applied to various substrate processing apparatuses such as a CVD apparatus, an oxide film forming apparatus, a diffusion apparatus, and an annealing apparatus.

Although the wafer processing has been described in the above-described embodiments, the object to be treated may be a photo-mask, a printed circuit board, an LCD panel, a compact disk, and a magnetic disk (MD).

(Supplementary Note)

The present invention includes the following embodiments.

(Supplementary Note 1)

According to an embodiment of the present invention, there is provided a substrate processing apparatus, comprising: a process chamber configured to accommodate loaded substrates; a gas supply system configured to supply a process gas to the substrates; a pair of electrodes arranged in a stacked direction of the substrates; a high-frequency power source configured to supply a high-frequency power to the pair of the electrodes to generate plasma for exciting the process gas; a variable impedance element connected to a front end opposite to the high-frequency power source in the pair of the electrodes; and a control unit configured to change an output frequency of the high-frequency power source during the processing of the substrates.

(Supplementary Note 2)

Preferably, the pair of the electrodes has a rod shape having one end opened.

(Supplementary Note 3)

Preferably, the substrate processing apparatus further comprises: a pair of protecting pipes having upper ends closed, and disposed to cover the pair of the electrodes; and a mounting pipe air-tightly sealed between the pair of the protecting pipes, wherein the variable impedance element is disposed inside the mounting pipe.

(Supplementary Note 4)
Preferably, the variable impedance element is configured by a parallel resonance circuit comprising a coil and a variable condenser arranged in parallel, and both ends of the variable impedance element are connected in series to the pair of the electrodes.

(Supplementary Note 5)
Preferably, the control unit controls the high-frequency power source to continue to change the output frequency of the high-frequency power source at least during the generation of the plasma.

(Supplementary Note 6)
According to another embodiment of the present invention, there is provided a substrate processing apparatus, comprising: a reaction tube configured to accommodate substrates and partitioned into a film forming space where desired films are formed on the substrates, and a plasma generation space where plasma is generated; a first gas supply system configured to supply a first process gas to the film forming space; a second gas supply system configured to supply a second process gas to the plasma generation space; a pair of electrodes disposed in the plasma generation space; a high-frequency power source configured to supply a high-frequency power to the pair of the electrodes to generate plasma for exciting the second process gas; a variable impedance element connected to a front end opposite to the high-frequency power source in the pair of the electrodes; and a control unit configured to control at least the first gas supply system, the second gas supply system, and the high-frequency power source, wherein the control unit controls the first gas supply system, the second gas supply system and the high-frequency power source so that the first process gas and the second process gas excited by the plasma are alternately supplied to form a film on the surface of the substrate, and the control unit changes the output frequency of the high-frequency power source during the generation of the plasma.

(Supplementary Note 7)
Preferably, the pair of the electrodes has a rod shape having one end opened.

(Supplementary Note 8)
Preferably, the substrate processing apparatus further comprises: a pair of protecting pipes having upper ends closed, and disposed to cover the pair of the electrodes; and a mounting pipe air-tightly sealed between the pair of the protecting pipes, wherein the variable impedance element is disposed inside the mounting pipe.

(Supplementary Note 9)
Preferably, the variable impedance element is configured by a parallel resonance circuit comprising a coil and a variable condenser arranged in parallel, and both ends of the variable impedance element are connected in series to the pair of the electrodes.

(Supplementary Note 10)
Preferably, the control unit controls the high-frequency power source to continue to change the output frequency of the high-frequency power source at least during the generation of the plasma.

(Supplementary Note 11)
According to another embodiment of the present invention, there is provided a method for manufacturing a semiconductor device, the method comprising: (a) loading a substrate into a process chamber; (b) exposing the substrate to a first process gas; (c) exhausting the first process gas; (d) exposing the substrate to a second process gas which is plasma-excited by applying a high-frequency power from a high-frequency power source to a pair of electrodes; (e) exhausting the second process gas; and (f) unloading the substrate from the process chamber, wherein a film is formed on the substrate by repeating the operations (b)~(e) alternately a plurality of times, and the output frequency of the high-frequency power source is changed in the operation (d).

(Supplementary Note 12)
Preferably, the output frequency of the high-frequency power source are changed a plurality of times at a predetermined period in the operation (d).

(Supplementary Note 13)
According to another aspect of the present invention, there is provided a substrate processing apparatus, comprising: a reaction tube configured to accommodate a plurality of substrates in stacks and form a substrate processing space; a wall member comprising a plurality of small holes installed in a substrate stacking direction and forming a buffer space of a process gas together with a part of a wall of the reaction tube; a gas supply unit communicating with the inside of the buffer space and supplying the process gas into the buffer space; a pair of electrodes disposed inside the buffer space to form an activation region of a reaction gas; a high-frequency power source supplying a high-frequency power to the pair of electrodes and generating plasma for activating the process gas, wherein the gas supplied from the gas supply unit is activated inside the buffer space, and the substrate is processed by introducing the activated gas into the substrate processing space through the plurality of small holes; a variable impedance element connected to a front end opposite to the high-frequency power source in the pair of the electrodes; and a control unit configured to change an output frequency of the high-frequency power source during the processing of the substrates.

(Supplementary Note 14)
Preferably, the pair of the electrodes has a rod shape having one end opened.

(Supplementary Note 15)
Preferably, the substrate processing apparatus further comprises: a pair of protecting pipes having upper ends closed, and disposed to cover the pair of the electrodes; and a mounting pipe air-tightly sealed between the pair of the protecting pipes, wherein the variable impedance element is disposed inside the mounting pipe.

(Supplementary Note 16)
Preferably, the variable impedance element is configured by a parallel resonance circuit comprising a coil and a variable condenser arranged in parallel, and both ends of the variable impedance element are connected in series to the pair of the electrodes.

(Supplementary Note 17)
Preferably, the control unit controls the high-frequency power source to continue to change the output frequency of the high-frequency power source at least during the generation of the plasma.

What is claimed is:
1. A substrate processing apparatus, comprising:
  a process chamber configured to accommodate loaded substrates;
  a gas supply system configured to supply a process gas to the substrates;
  a pair of electrodes arranged in a stacked direction of the substrates;
  a high-frequency power source configured to supply a high-frequency power to the pair of the electrodes to generate plasma by exciting the process gas;
  a variable impedance element connected to a front end of the pair of the electrodes opposite to the high-frequency power source, the variable impedance element comprising a parallel resonance including a coil and a variable condenser arranged in parallel, both ends of the variable impedance element being connected to the pair of the electrodes in series;

a control unit configured to change an output frequency of the high-frequency power source;

a pair of protecting pipes having upper ends closed, and disposed to cover the pair of the electrodes; and a mounting pipe air-tightly sealed between the pair of the protecting pipes, wherein the variable impedance element is disposed inside the mounting pipe.

2. The substrate processing apparatus of claim 1, wherein the pair of the electrodes has a rod shape having one end open.

3. The substrate processing apparatus of claim 1, wherein the control unit controls the high-frequency power source to continuously change the output frequency of the high-frequency power source at least during the generation of the plasma.

4. A substrate processing apparatus, comprising:

a reaction tube configured to accommodate substrates and partitioned into a film forming space where desired films are formed on the substrates, and a plasma generation space where plasma is generated;

a first gas supply system configured to supply a first process gas to the film forming space;

a second gas supply system configured to supply a second process gas to the plasma generation space;

a pair of electrodes disposed in the plasma generation space;

a high-frequency power source configured to supply a high-frequency power to the pair of the electrodes to generate plasma by exciting the second process gas;

a variable impedance element connected to a front end of the pair of the electrodes opposite to the high-frequency power source, the variable impedance element comprising a parallel resonance circuit including a coil and a variable condenser arranged in parallel, both ends of the variable impedance element being connected to the pair of the electrodes in series;

a pair of protecting pipes having upper ends closed, and disposed to cover the pair of the electrodes;

a mounting pipe air-tightly sealed between the pair of the protecting pipes, wherein the variable impedance element is disposed inside the mounting pipe; and a control unit configured to control at least the first gas supply system, the second gas supply system and the high-frequency power source, wherein the control unit controls the first gas supply system, the second gas supply system and the high-frequency power source in a manner that the first process gas and the second process gas excited by the plasma are alternately supplied to form a film on the surfaces of the substrates, and the control unit changes the output frequency of the high-frequency power source.

5. The substrate processing apparatus of claim 4, wherein the pair of the electrodes has a rod shape having one end open.

6. The substrate processing apparatus of claim 4, wherein the control unit controls the high-frequency power source to continuously change the output frequency of the high-frequency power source at least during the generation of the plasma.

7. A substrate processing apparatus, comprising:

a reaction tube configured to accommodate a plurality of substrates in stacks and define a substrate processing space;

a wall member comprising a plurality of holes installed in a substrate stacking direction and forming a buffer space of a process gas together with a part of a wall of the reaction tube;

a gas supply unit communicating with an inside of the buffer space and supplying the process gas into the buffer space;

a pair of electrodes disposed inside the buffer space to define an activation region of a reaction gas;

a high-frequency power source supplying a high-frequency power to the pair of electrodes to generate plasma by activating the process gas, wherein the gas supplied from the gas supply unit is activated inside the buffer space, and the plurality of substrates is processed by introducing activated gas into the substrate processing space through the plurality of holes;

a variable impedance element connected to a front end the pair of the electrodes opposite to the high-frequency power source, the variable impedance element comprising a parallel resonance circuit including a coil and a variable condenser arranged in parallel, both ends of the variable impedance element being connected to the pair of the electrodes in series;

a control unit configured to change an output frequency of the high-frequency power source;

a pair of protecting pipes having upper ends closed, and disposed to cover the pair of the electrodes; and a mounting pipe air-tightly sealed between the pair of the protecting pipes, wherein the variable impedance element is disposed inside the mounting pipe.

8. The substrate processing apparatus of claim 7, wherein the pair of the electrodes has a rod shape having one end open.

9. The substrate processing apparatus of claim 7, wherein the control unit controls the high-frequency power source to continuously change the output frequency of the high-frequency power source at least during the generation of the plasma.

* * * * *